(12) United States Patent
Chen

(10) Patent No.: US 7,230,310 B2
(45) Date of Patent: Jun. 12, 2007

(54) SUPER-JUNCTION VOLTAGE SUSTAINING LAYER WITH ALTERNATING SEMICONDUCTOR AND HIGH-K DIELECTRIC REGIONS

(75) Inventor: Xingbi Chen, Shanghai (CN)

(73) Assignee: Tongji University, Shanghai (CN)

( * ) Notice: Subject to any disclaimer, the term of this patent is extended or adjusted under 35 U.S.C. 154(b) by 0 days.

(21) Appl. No.: 10/504,575

(22) PCT Filed: Sep. 24, 2002

(86) PCT No.: PCT/CN02/00674

§ 371 (c)(1),
(2), (4) Date: Aug. 13, 2004

(87) PCT Pub. No.: WO03/044864

PCT Pub. Date: May 30, 2003

(65) Prior Publication Data

US 2005/0116284 A1    Jun. 2, 2005

(30) Foreign Application Priority Data

Nov. 21, 2001   (CN) .............................. 01 1 39957

(51) Int. Cl.
*H01L 23/58* (2006.01)
(52) U.S. Cl. .............. 257/487; 257/329; 257/618; 257/E29.074
(58) Field of Classification Search .............. 257/329, 257/487, 618, E29.074
See application file for complete search history.

(56) References Cited

U.S. PATENT DOCUMENTS 5,216,275 A * 6/1993 Chen ................... 257/493
5,315,144 A   5/1994 Cherne
5,627,092 A   5/1997 Alsmeier et al.
6,590,240 B1 * 7/2003 Lanois ................. 257/256
6,605,829 B2 * 8/2003 Terashima ............ 257/139
6,696,741 B1 * 2/2004 Ronsisvalle et al. ... 257/487
6,720,615 B2 * 4/2004 Fujihira ............... 257/328
6,853,033 B2 * 2/2005 Liang et al. .......... 257/339

FOREIGN PATENT DOCUMENTS

CN    1056018    11/1991
CN    911018453X  12/1992

* cited by examiner

*Primary Examiner*—Richard T. Elms
*Assistant Examiner*—Andrew O Arena
(74) *Attorney, Agent, or Firm*—Venable, LLP; James R. Burdett

(57) ABSTRACT

A semiconductor power device includes a device feature layer, a substrate contact layer and a voltage-sustaining layer between them. The voltage-sustaining layer includes alternating semiconductor and high permittivity dielectric regions, where each region extends from the device feature layer to the substrate contact layer. Due to the flux of charges transported dominantly through the dielectric regions, the whole voltage-sustaining layer behaves like a semiconductor having a much higher electric permittivity than that of the semiconductor itself, so that the field produced by the ionized impurities of the semiconductor regions can be much higher than that of the conventional one for sustaining the same reverse voltage, and the specific on-resistance can be lower than that of the conventional one. The use of high permittivity dielectric regions can also be applied to the charge-balance structure, i.e., to COOLMOST.

9 Claims, 16 Drawing Sheets

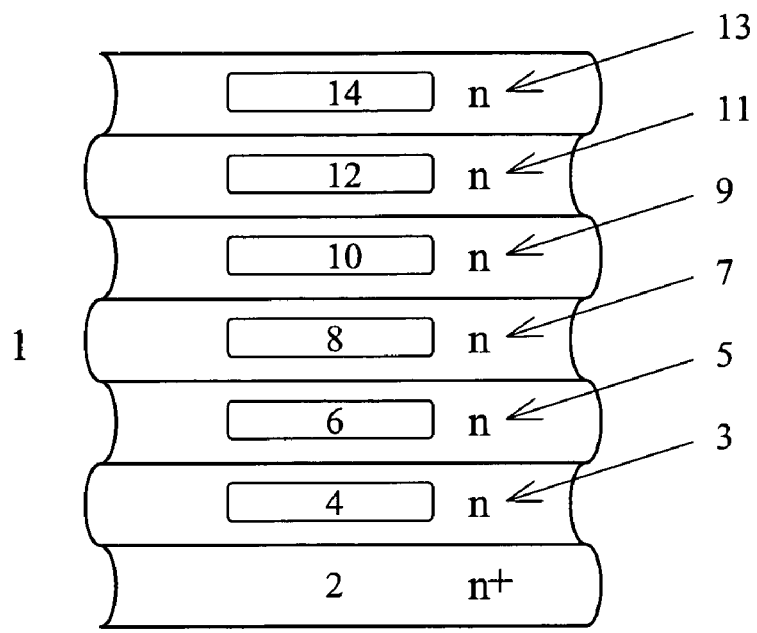
Fig. 1 (a) Prior Art
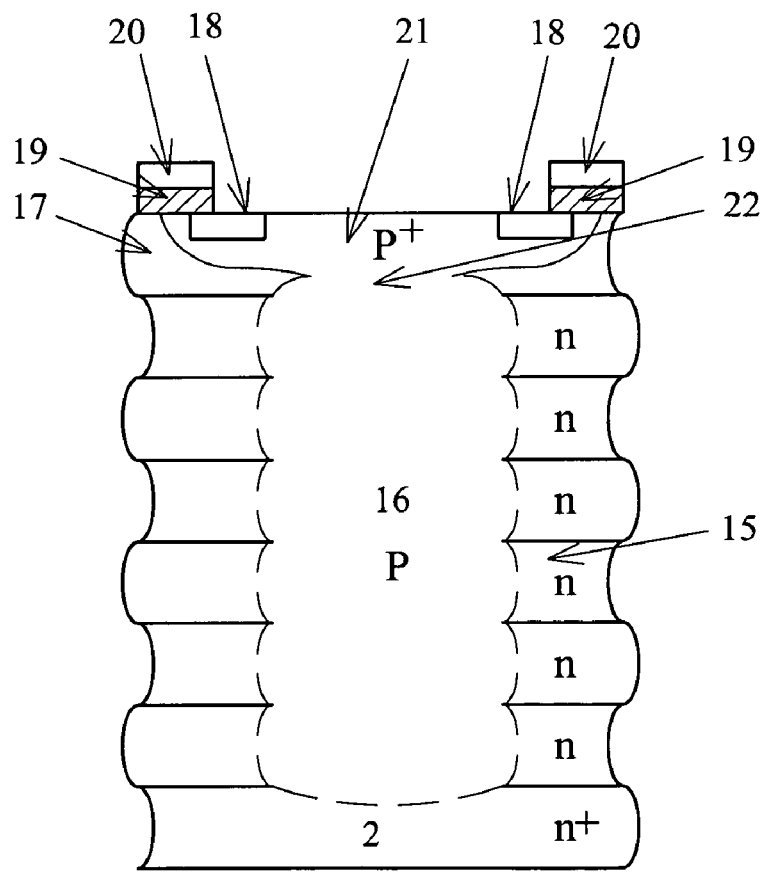
Fig. 1 (b) Prior Art

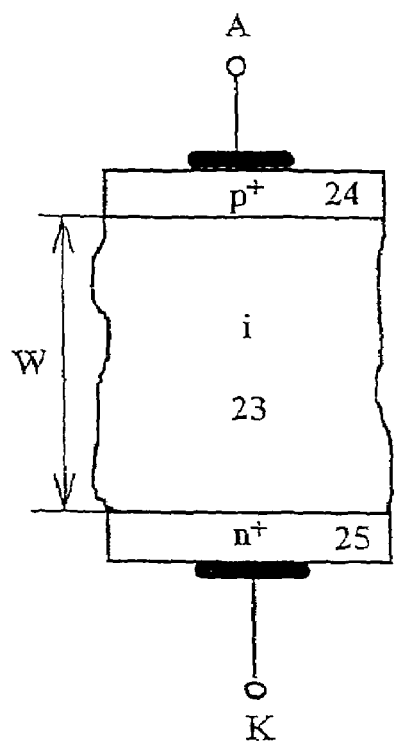
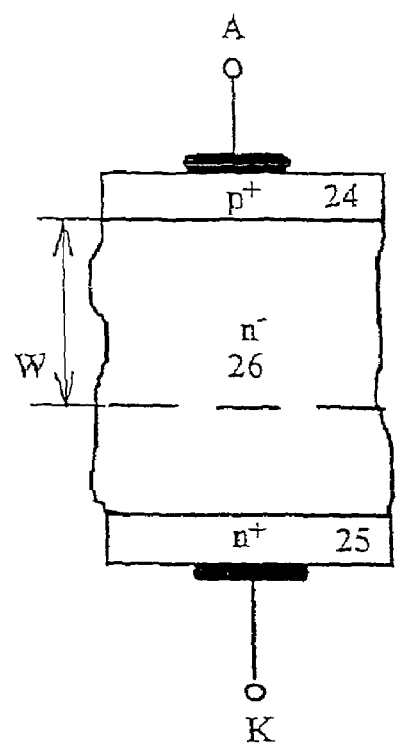
Fig. 2 (a)  Fig. 2 (b)
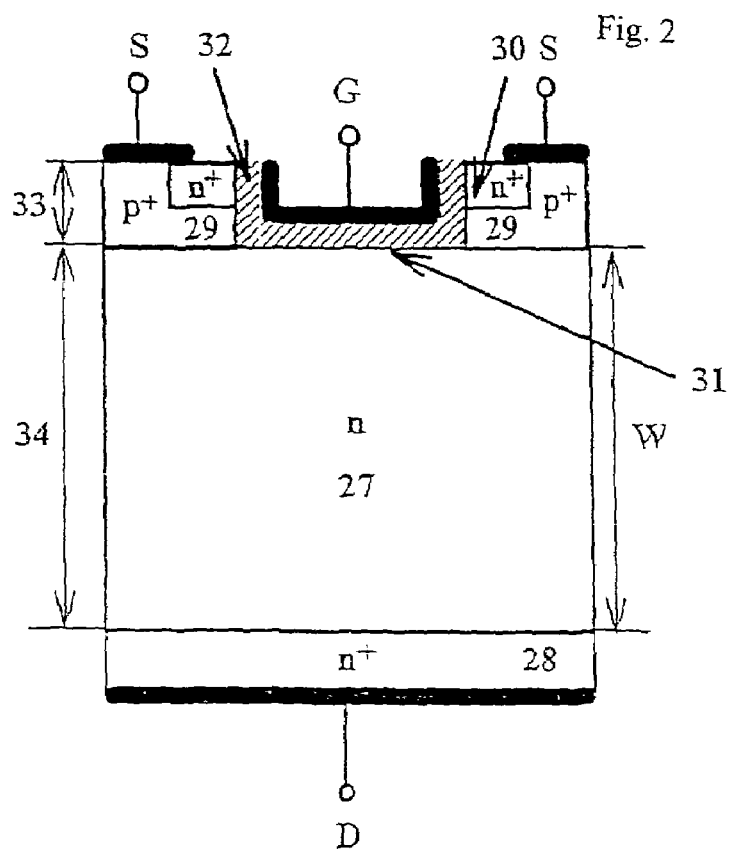
Fig. 2 (c)

US 7,230,310 B2

SUPER-JUNCTION VOLTAGE SUSTAINING LAYER WITH ALTERNATING SEMICONDUCTOR AND HIGH-K DIELECTRIC REGIONS

FIELD OF INVENTION

This invention relates to semiconductor devices, in particular to the voltage-sustaining layer of semiconductor power devices.

BACKGROUND OF THE INVENTION

It is well known that in a conventional power device, the reverse voltage applied across an n⁺-region and a p⁺-region is sustained by a lightly doped thick semiconductor layer. Such a layer is called hereafter voltage-sustaining layer (VSL). As for a high-voltage power device, the specific on-resistance $R_{on}$ (or the on-voltage) is also mainly determined by the voltage-sustaining layer, called as drift region in most cases. The lighter the doping of this layer is, and/or the thicker this layer is, the higher the breakdown voltage $V_B$ is, however, and the higher the on-resistance (or on-voltage) also is. In many power devices, one of the most important problems is to obtain both high breakdown voltage and low on-resistance. The relation between $R_{on}$ and $V_B$ is an obstruction to make high performance power devices. Moreover, the above-mentioned $R_{on}$ refers to the resistance per unit area of the conduction region in the voltage-sustaining layer, whereas actually, there are always some non-conduction regions in the voltage-sustaining layer. For instance, the region under the source-body region of a vertical-type (longitudinal-type) MOSFET and the region under the base electrode contact region of a bipolar transistor are both non-conduction regions.

The above problem was solved by the inventor (Chinese Patent No. ZL91101845.X, U.S. Pat. No. 5,216,275). The solution thereof is to utilize a composite buffer layer (or charge balance layer, shortly as CB-layer) between a p⁺-region and an n⁺-region to sustain voltage. The CB-layer contains two kinds of regions with opposite conduction type. These two kinds of regions are alternately arranged, as viewed from any cross-section parallel to the interface between the CB-layer and the n⁺ (or p⁺) region, whereas the previous VSL is always a semiconductor of single conduction type. The invention also discloses the MOST composed by the VSL. The on-resistance per unit area $R_{on}$ is proportional to $V_B^{1.3}$. This represents a breakthrough to the conventional relation of VSL; meanwhile the other electrical performances of the MOST remain almost same.

Within the past few years, a significant change has taken place in the semiconductor power device industry. Through the use of structure of Super-Junction devices (i.e., structure of CB layer), COOLMOSTs have been capable of providing high voltage and high current.

FIGS. 1(a) and 1(b) illustrate a method of manufacturing a Super-Junction power device 1. The process begins with a semiconductor piece of a substrate 2 growing a first epitaxial layer 3. In the figures, the substrate 2 is a heavily doped n⁺ layer and the first epitaxial layer 3 is a lightly doped n layer. Ion implantation is performed to make a layer of p-type region 4 on layer 3. In general, an epitaxial layer is required for each 50 to 100 volts of sustaining voltage. Accordingly, as for a 600 volts transistor, it is required to sequentially deposit respective n-type epitaxial layers indicated by 5, 7, 9, 11 and 13 in FIG. 1(a). After each epitaxial layer is completed, it is required to make respective p-type ion implantation layer indicated by 4, 6, 8, 10, 12 and 14 in FIG. 1(a).

After the diffusion of p-type ion implantation layer 4, 6, 8, 10, 12 and 14, the p-region 16 is formed, and the region without influence of ion implantation is n-region 15 shown in FIG. 1(b). Thus the p-region and n-region with an arrangement are formed. The device layer, which is called device feature layer 17, is then performed. The device feature layer 17 includes n⁺ source region 18 formed by ion implantation, oxidation layer 19, and metal gate or polysilicon gate 20 thereon. There is a p⁺ region 21 between the two n⁺ source regions 18, below which there is a deep junction p⁺ region 22. The deep junction p⁺ region 22 connects to the p⁺ region 21.

Obviously, the above-mentioned manufacture method uses many times of epitaxy and it is very costly. Moreover, the CB-layer structure uses the principle of charge compensation, wherein the dose of dopants of p-regions and n-regions must be controlled precisely and this leads to increase of difficulty in manufacturing and increase of the cost of devices.

Another deficiency of the MOST with CB-layer structure is that, when the conduction current is very large, the electric charge of the carriers themselves affects the balance of the electric charge, which leads to a decrease of breakdown voltage with increasing of the current, i.e., a secondary breakdown phenomena. The safe-operating area (SOA) is therefore not very ideal.

Still another deficiency of the MOST with CB-layer structure is introduced by the two voltages existing between p-region and n-region, one of which is the built-in voltage, and the other is additional voltage produced by the on-resistance in a region when a current flows in the region. A depletion region existed between the two regions is caused by the two voltages, so that the area of effective section of the conduction region decreases. In other words, the on-resistance increases with the increasing of the current.

SUMMARY OF THE INVENTION

The purpose of this invention is to provide a semiconductor device with a new structure of voltage-sustaining layer (VSL), which is a compound voltage-sustaining layer including semiconductor and high permittivity dielectric (High K), called as High K and Semiconductor VSL or HKS-Layer. It can avoid the above-mentioned deficiencies and improve the relationship between the on-resistance $R_{on}$ and the breakdown voltage $V_B$, while maintaining high switching speed.

This invention provides a semiconductor device, which includes a VSL having two opposite surfaces. One surface contacts directly or indirectly through a conductive layer, say, a semiconductor layer of a first conductivity type, to the substrate, and this surface is called interface of first type. Another surface contacts to said device feature layer, say, a semiconductor layer of a second conductivity type, and this surface is called interface of second type. The interface of the first type is parallel or approximately parallel to the interface of second type.

The voltage-sustaining layer comprises one cell or a multiple of cells close packed. Each cell has at least one high permittivity dielectric region and one semiconductor region of one conductivity type or a multiple semiconductor regions of different conductivity type. Each semiconductor region has two opposite surfaces forms directly parts of the interface of the first type and of the interface of the second type. Or, one of the two opposite surfaces forms indirectly a part of the interface of the first type through a thin dielectric layer. Two opposite surfaces of each high permittivity dielectric region form the remaining parts of the interface of the first type and of the interface of the second type.

Each interface constructed by two neighboring semiconductor regions of different conductivity type inside the voltage-sustaining layer is called an interface of a third type. Each interface constructed by each said dielectric region and its neighboring semiconductor regions inside the voltage-sustaining layer is called an interface of a fourth type. Each interface of the third type as well as each interface of the fourth type is perpendicular to or approximately perpendicular to the interface of the first type.

The electric permittivity in almost total area of each dielectric region is much higher than the electric permittivity of the semiconductor region, so that under a reverse bias voltage across the substrate contact layer and the device feature layer, the electric flux produced by the charges of ionized impurities in the semiconductor regions of the voltage sustaining region and the charges in the device feature layer close to the semiconductor regions as well as the charges in the substrate contact layer close to the semiconductor regions all flow mainly in said high permittivity dielectric region. The whole voltage-sustaining layer behaves like a semiconductor having a much higher electric permittivity than that of the semiconductor itself, so that the field produced by the ionized impurities of the semiconductor regions can be much higher than that of the conventional one for sustaining the same reverse voltage, and the specific on-resistance can be lower than that of the conventional one.

BRIEF DESCRIPTION OF THE FIGURES

FIG. 1(a) is a schematic diagram illustrating a method of manufacturing COOLMOST in prior art, wherein many times of epitaxy and ion implantation are shown.

FIG. 1(b) is a schematic diagram illustrating a method of manufacturing COOLMOST in prior art, wherein a p-region surrounded with n-regions is formed after diffusion.

DETAILED DESCRIPTION OF THE PREFERRED EMBODIMENTS

Figure 2:
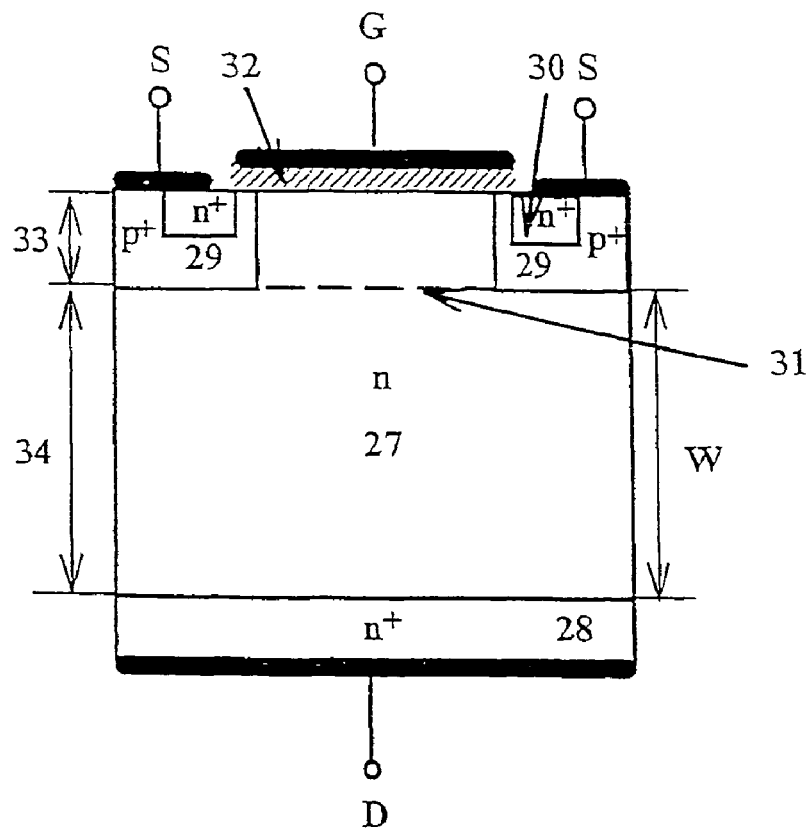
FIG. 2(a) illustrates the voltage-sustaining layer (within the distance of W) of a pin diode.
FIG. 2(b) illustrates the voltage-sustaining layer (within the distance of W) of a $p^+n^-n^+$ diode.
FIG. 2(c) illustrates the voltage-sustaining layer (within the distance of W) of an n-RMOST.
FIG. 2(d) illustrates the voltage-sustaining layer (within the distance of W) of an n-VDMOST.
FIG. 2(e) illustrates the voltage-sustaining layer (within the distance of W) of a Schottky diode.
FIG. 2(f) illustrates the voltage-sustaining layer (within the distance of W) of an IGBT close to punch-through condition.
Figure 2:
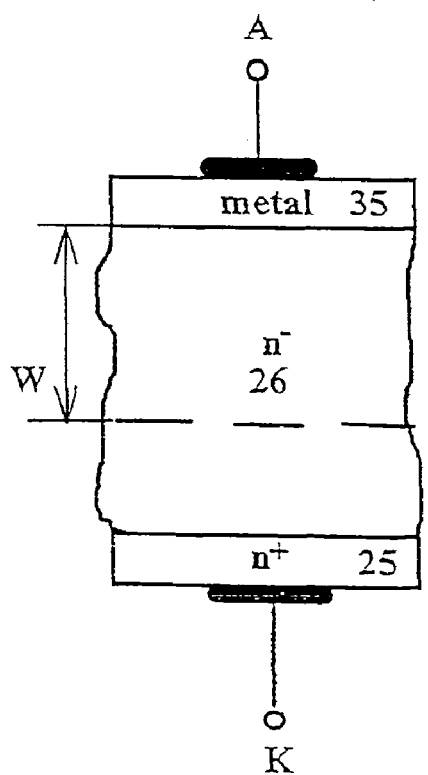
Figure 2:
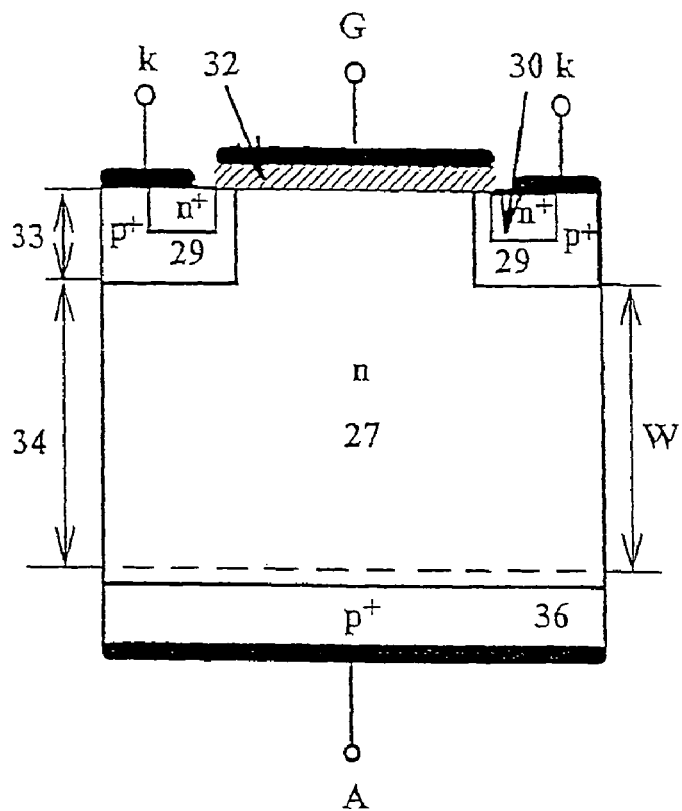

In a semiconductor power device, there normally is a voltage-sustaining layer between a p$^+$-region (or a region equivalent to p$^+$-region) and an n$^+$-region (or a region equivalent to n$^+$-region). FIG. 2(a) is a schematic diagram of a pin diode, which is formed by a p$^+$-region 24, n$^+$-region 25 and i-region 23, wherein i-region 23 is the voltage-sustaining layer. Here, A represents anode and K represents cathode of the diode. FIG. 2(b) is a schematic diagram of a p$^+$n$^-$n$^+$ diode, wherein if the thickness of the depletion layer is W when the applied reverse bias voltage is close to the breakdown voltage, the region which has the thickness of W is voltage-sustaining layer. FIG. 2(c) schematically shows an n-RMOST. Here, S is the source electrode, G is the gate electrode and D is the drain electrode. Although the region where gate oxide layer 32 locates above the plane 31 is not a p$^+$-region, yet in actual use the potential above plane 31 and below the gate oxide layer 32 has no significant difference with the potential in the interface between the p$^+$ source-substrate region 29 and the n-region 27, and the difference thereof is much smaller than the breakdown voltage $V_B$ of the device. Therefore, plane 31 can be approximately considered as an equal potential plane. In the following discussion on sustaining voltage, the area above plane 31 is called as device feature layer 33. The effect of device feature layer 33 on electric field distribution can be considered as that of a p$^+$-layer. FIG. 2(d) schematically shows a VDMOST. Here, the potential in the plane 31 can approximately be treated as equal as that in the p$^+$ source-substrate region 29. Thus, in this invention, the area from plane 31 to the interface of the n-region 27 and the n$^+$-drain region 28 is considered as the voltage-sustaining layer 34, while the area above the plane 31 is considered as device feature layer 33. Here, it is assumed that in the above two MOST, the edges of depletion region have already reached the interface between the n-region 27 and the n$^+$-drain region 28 when the applied reverse bias voltage is lower than the breakdown voltage. Therefore the thickness of the voltage-sustaining layer is W as shown in the figures. This assumption is in accordance with actual situation as usual.

In above cases, the two surfaces of the voltage-sustaining are contacted to p$^+$ semiconductor region and n$^+$ (or n) semiconductor region respectively. Actually, the device feature layer may be a metal instead of a p$^+$ semiconductor region. The metal and n-region of the voltage-sustaining layer forms a Schottky contact. FIG. 2(e) schematically shows such a Schottky diode, wherein metal layer 35 substitutes the p$^+$-layer in above cases. Similarly, underside of the voltage-sustaining layer may not contact with n$^+$ (or n) region, but with metal, such that a Schottky contact is formed. Therefore, the region contacted in underside of the voltage-sustaining layer is called as contact layer. FIG. 2(f) shows a case of an IGBT close to punch-through condition. The region contacted in underside of the voltage-sustaining layer may be taken as p$^+$-layer 36.

Figure 3:
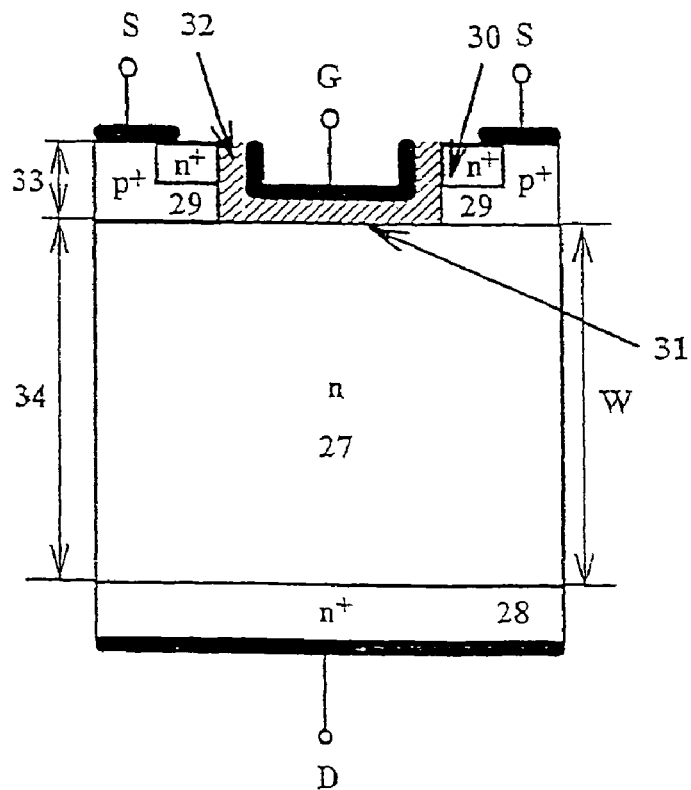
FIG. 3(a) illustrates a schematic structure of a conventional RMOST and its electric field distribution.
FIG. 3(b) illustrates a conventional RMOST and its electric field distribution, wherein the electric field distribution when the bias voltage is close to the breakdown voltage is shown.
FIG. 3(c) illustrates a conventional RMOST and its electric field distribution, wherein a constant component of the electric field is shown.
FIG. 3(d) illustrates a conventional RMOST and its electric field distribution, wherein a component varying with the distance of the electric field is shown.
Figure 3:
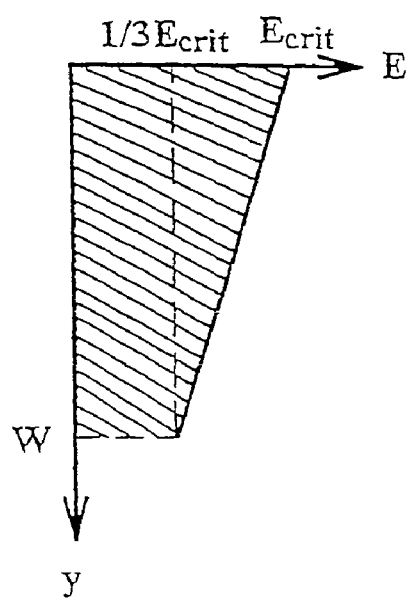
Figure 3:
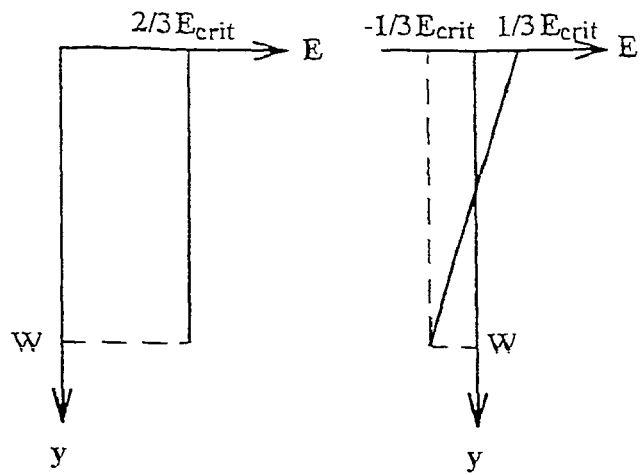

In order to describe the principle of this invention, the reason why the relation between breakdown voltage $V_B$ and on-resistance $R_{on}$ in conventional power MOS devices is not ideal will now be briefly described. FIG. 3(a) schematically shows an RMOST. It is formed by n-region 27, n$^+$ source region 30, p$^+$ source-substrate region 29 and n$^+$ drain region 28. Here G represents the gate electrode, S represents the source electrode and D represents the drain electrode. The voltage-sustaining layer thereof is the depletion region 34 which has the thickness of W$^-$ as shown in the figure. FIG. 3(b) shows the electric field distribution when the bias voltage is close to the breakdown voltage in RMOST, wherein E represents the electric field along the y-axis. According to Poisson's equation, the divergence of the electric field is $qN_D/\epsilon_s$, wherein $N_D$ represents the donor concentration of the n-region. Avalanche breakdown occurs at the case that maximum electric field reaches to the critical field for breakdown ($E_{crit}$). The value of $E_{crit}$ is about $3 \cdot 10^5$ V/cm. The shaded area between the E-line and the y-axis represents the integral of the electric field along the path, which is the breakdown voltage $V_B$. Obviously, for obtaining a high value of $V_B$, the following two conditions must be satisfied: (1) the gradient of the electric field is small, i.e., $N_D$ is small; and (2) the width of the depletion region (W) is large. However, a small value of $N_D$ means the concentration of carriers is small and the resistivity is high in the case of the turn-on. A large W means the conduction path is long. Since on-resistance $R_{on}$ is directly proportional to resistivity and path length, it will cause the on-resistance $R_{on}$ to be greatly increased. As for a power MOST, the optimum design is to make the electric field at the boundary of the n-region 27 and the $n^+$-drain region 28 be $E_{crit}/3$. In this case, the breakdown voltage will be $2E_{crit} \cdot W/3$.

The above electric field distribution can be considered as a superposition of two electric fields, wherein one is an electric field caused by applying external voltage $V_B$ to a pin diode, as shown in FIG. 3(c), and the value of the electric field is $2E_{crit}/3$ which does not vary with the distance; the other is an electric field linearly varying from a value of $-E_{crit}/3$ at the bottom to a value of $+E_{crit}/3$ at the top, as shown in FIG. 3(d), and its slope is $qN_D/\epsilon_s$ which has two peak values of $-qN_DW/2\epsilon_s$ and $+qN_DW/2\epsilon_s$. The reason that the on-resistance $R_{on}$ increases with increasing of the breakdown voltage $V_B$ is due to the existing of the latter electric field.

Figure 4A:
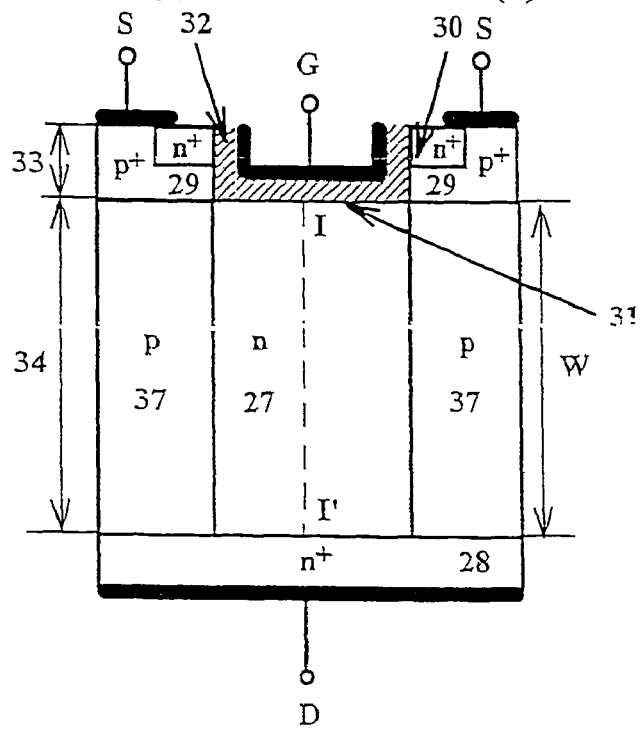
FIG. 4(a) illustrates a schematic structure of CB-RMOST.
Figure 4:
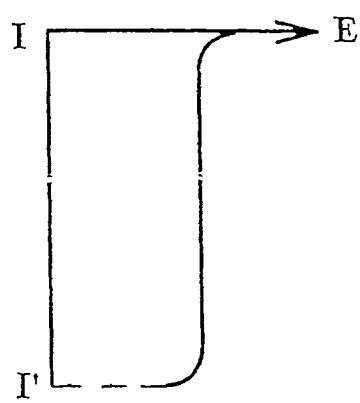
FIG. 4(b) illustrates the electric field distribution along the line I–I' of FIG. 4(a), wherein the electric field distribution when the bias voltage is close to the breakdown voltage is shown.
FIG. 4(c) illustrates a constant component of the electric field shown in FIG. 4(b).
FIG. 4(d) illustrates a component varying with the distance of the electric field shown in FIG. 4(b).
Figures 4C, 4D:
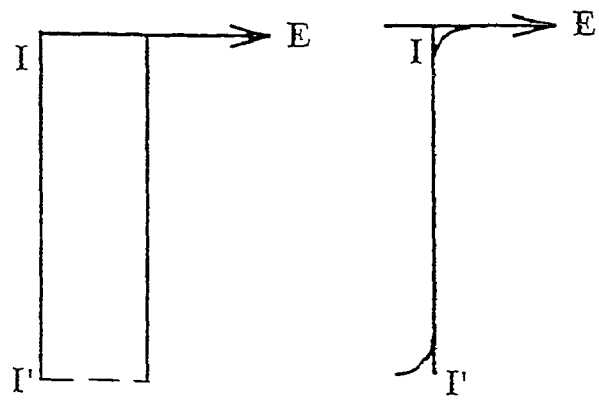

The CB voltage-sustaining layer structure (Chinese patent for invention: ZL91101845.X and U.S. patent for invention: U.S. Pat. No. 5,216,275) proposed by the inventor of this application has solved the above problem. Why the CB structure can improve the relationship between the on-resistance $R_{on}$ and the breakdown voltage $V_B$ will be briefly described as follows. FIG. 4(a) schematically shows a CB-RMOS. Its voltage-sustaining layer 34 is formed of alternate arrangement of n-region 27 and p-region 37, and the thickness thereof is W. When a reverse bias voltage is applied on the CB-RMOST such that n-regions 27 and p-regions 37 are fully depleted, the electric fluxes generated by the positive charges of the ionized donors in n-region 27 are terminated on the negative charges of the ionized acceptors in the neighboring p-region 37. Therefore, the electric field along the line I–I' in the n-region 27 is shown as the solid curve in FIG. 4(b). It's almost unchanged, except a little variation near the plane 31 and near the $n^+$-drain region 28. This electric field can also be decomposed into two components as shown in FIG. 4(c) and FIG. 4(d). The electric field shown in FIG. 4(c) corresponds to the case of a pin diode, which is similar to that in FIG. 3(c). FIG. 4(d) represents a vertical electric field generated by n-region 27. This electric field is much smaller than that in FIG. 3(d) under the condition of the same doping concentration. In fact, $N_D$ in the CB-structure can be very large, while such-generated electric field will still be very small. This is because the vertical electric field generated by the positive charges of ionized donor is not continuously accumulated from the middle of the voltage-sustaining layer. The electric fluxes generated by the positive charges of the ionized donors are mostly terminated laterally by the negative charges of the ionized acceptors in the surrounding p-region 37. Only those flux produced by the ionized donors located close to the center top are terminated vertically by the negative charges on the upper gate electrode G, and those flux terminated by negative charges of the ionized acceptors located close to the bottom edge of p-region 37 are produced by the positive charges of the ionized donors in $n^+$-region 28 beneath it.

This invention proposes a voltage-sustaining layer structure constructed by alternately arranging high permittivity dielectric material and semiconductor, as shown in FIGS. 5(a)–5(d), wherein HK represents high permittivity dielectric material.

The principle of this invention is as follows.

Figure 5:
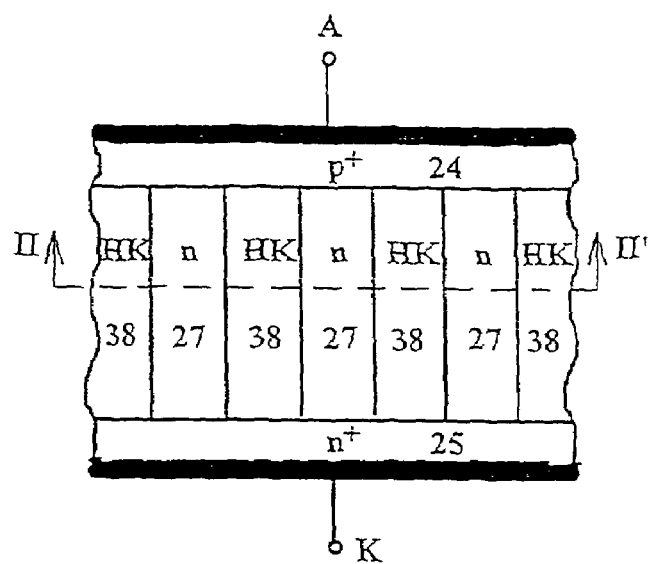
FIG. 5(a) is a schematic diagram of voltage-sustaining layer composed of an n-type semiconductor and high permittivity material (HKS voltage-sustaining layer).
FIG. 5(b) is a schematic diagram of voltage-sustaining layer composed of a p-type semiconductor and high permittivity material (HKS voltage-sustaining layer).
FIG. 5(c) is a schematic diagram of voltage-sustaining layer composed of an n-type semiconductor region and a p-type semiconductor region as well as a high permittivity material region (HKS voltage-sustaining layer).
FIG. 5(d) is a schematic diagram of voltage-sustaining layer composed of an n n-type semiconductor region and a p-type semiconductor region as well as a high permittivity material region (HKS voltage-sustaining layer), wherein one side of the high permittivity material contacts with p-type semiconductor region, and the other side contacts with n-type semiconductor region.
Figure 5:
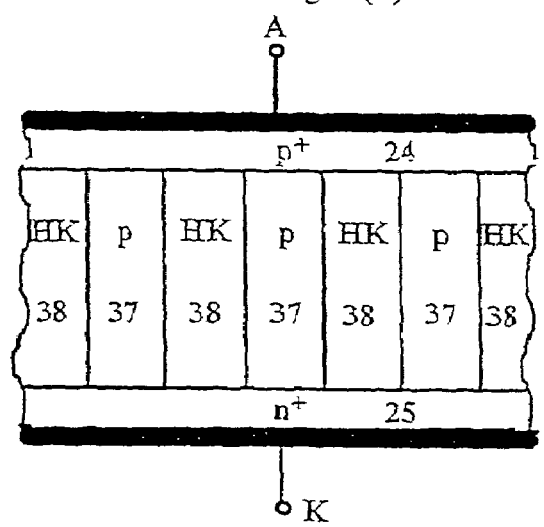
Figure 5:
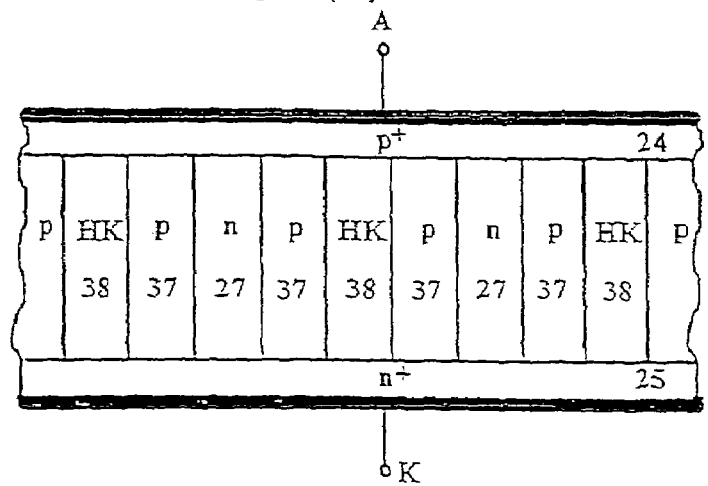
Figure 5:
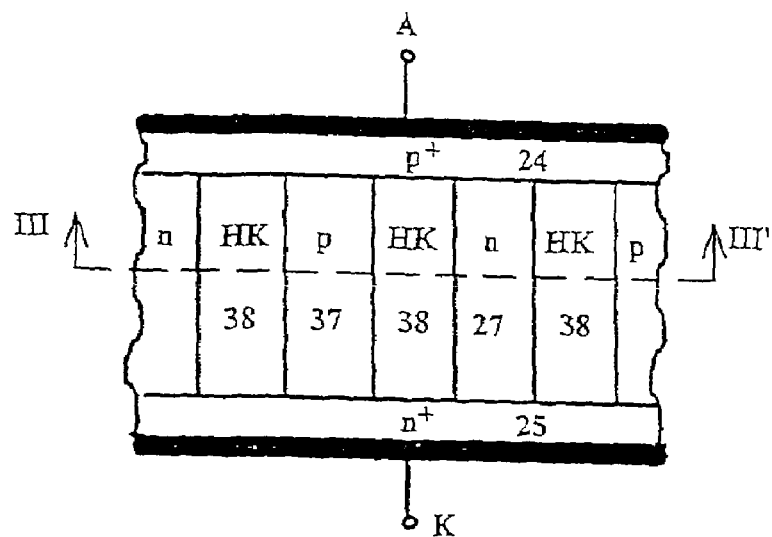

In FIG. 5(a), suppose that both HK region 38 and n-region 27 are very narrow, then, it is equivalent to a combined material with permittivity much larger than $\epsilon_S$ and smaller than $\epsilon_D$, where $\epsilon_S$ and $\epsilon_D$ are the permittivities of semiconductor and the HK material respectively. Roughly speaking, if the permittivity after combination is $\epsilon_M$, then, $\epsilon_M \gg \epsilon_S$ when $\epsilon_D \gg \epsilon_S$. This causes such slope $qN_D/\epsilon_S$ as shown in FIG. 3(d) to be $qN_D/\epsilon_M$, which is very small under the condition of the same doping concentration. In other words, one can obtain the same peak value of the electric field, $E_{crit}/3$, by using a larger value of $N_D$.

When the HKS layer of this invention is used as voltage-sustaining layer, then the electric fluxes generated by the ionized donors of the depleted n-region 27 will first transversely flow to the neighboring high permittivity dielectric region 38, and then flow inside of region 38 upwards, and then flow inside of region 38 upwards, and eventually be absorbed by negative charges induced in the $p^+$-region 24. Therefore, the maximum of the electric field generated by the ionized donors of n-region 27 is much smaller than $qN_D \cdot W/2\epsilon_S$. And, in the high permittivity dielectric 38, the electric fluxes coming from n-region 27 are equivalent to make it generate a plurality of ionized donors. However, due to that ED is very large, these electric fluxes generate only a small electric field by themselves.

FIG. 5(c) and FIG. 5(d) show that high permittivity (HK) material is introduced into the CB-structure of the invention U.S. Pat. No. 5,216,275 by this inventor.

In FIG. 5(c), when both p-regions 37 and n-regions 27 are fully depleted, then, in the ideal situation, the electric fluxes generated by the positive charges of the ionized donors of n-region 27 are fitly all terminated by the ionized acceptors of p-region 37. In the not ideal situation, where the n-region 27 is too heavily doped, the redundant electric fluxes may enter inside of high permittivity dielectric 38, then flow to the top $p^+$-region 24 and terminate on negative charges induced in $p^+$-region 24. On the other hand, in the not ideal situation where the n-region 27 is too lightly doped, there are electric fluxes generated from the bottom $n^+$ region 25, and the electric fluxes flow to p-region 37 through the inside of the high permittivity dielectric, then terminate on the redundant negative charges of the ionized acceptors.

In FIG. 5(d), when both n-region 27 and p-region 27 are fully depleted, then, in the ideal situation, the electric fluxes generated by the positive charges of the ionized donors of n-region 27 flow through high permittivity dielectric region 38 and are terminated by the ionized acceptors in p-region 37. In the not ideal situation that the n-region 27 is too heavily doped, the redundant electric fluxes may flow to the top $p^+$-region 24 through high permittivity dielectric 38, then terminate on negative charges induced in $p^+$-region 24. On the other hand, in the not ideal situation that n-region 27 is too lightly doped, there are electric fluxes generated from the bottom $n^+$ region 25, and through the inside of the high permittivity dielectric 38 flow through the inside of the high permittivity dielectric 38 to p-region 37 and eventually terminate on the redundant negative charges of the ionized acceptors.

From above, it can be seen that in this invention, the semiconductor region of the voltage-sustaining layer may be n-type region or p-type region, or having both regions. Therefore, unless it is specially indicated, the semiconductor region is represented by S in the following description.

Figure 6A:
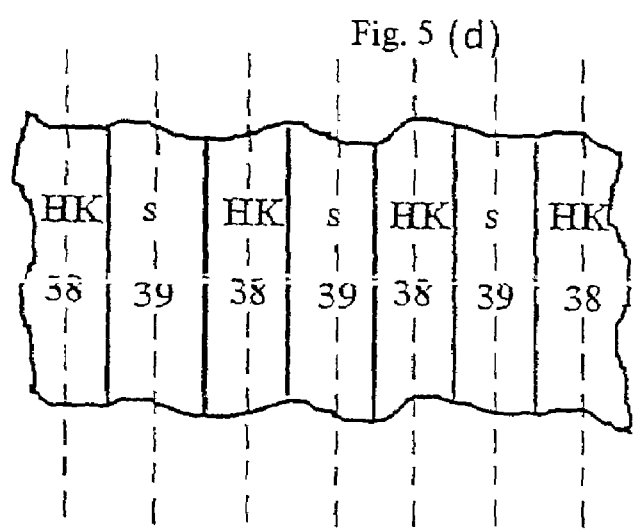
FIG. 6(a) is a schematic top-view at the cross-section II–II' of intedigitated pattern of the HKS voltage-sustaining layer shown in FIG. 5(a).
Figure 6B:
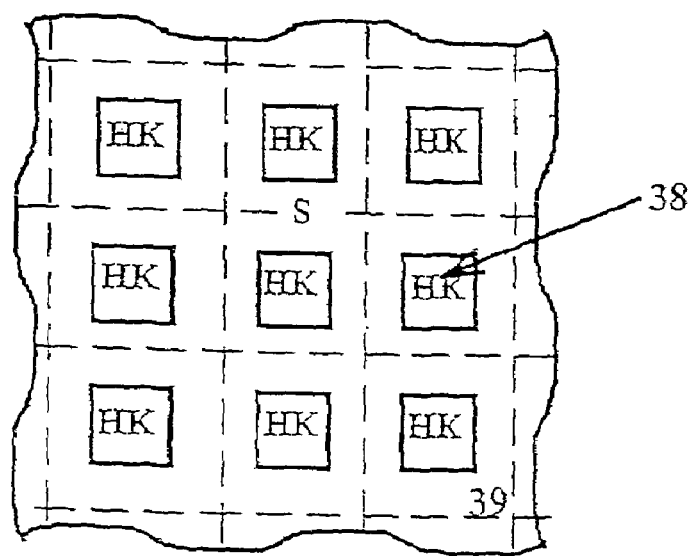
FIG. 6(b) is a schematic top-view at the cross-section II–II' of square cell of the HKS shown in FIG. 5(a), where S regions are all mutually connected.
Figure 6C:
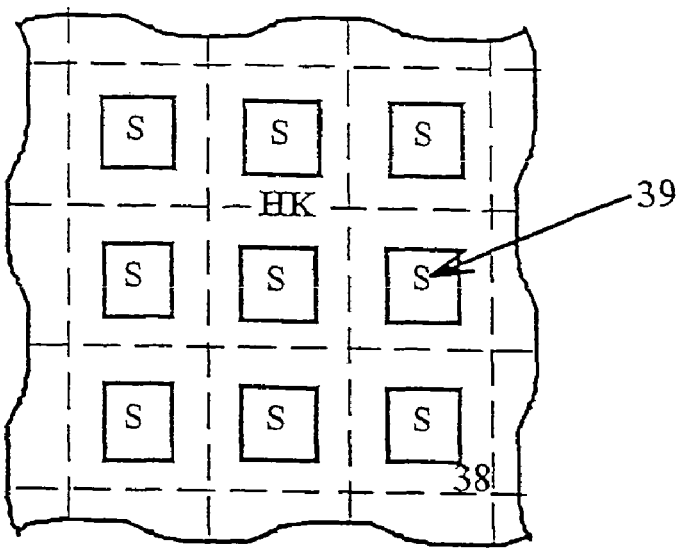
FIG. 6(c) is a schematic top-view at the cross-section II–II' of square cell of the HKS shown in FIG. 5(a), where HK regions are all mutually connected.
Figure 6D:
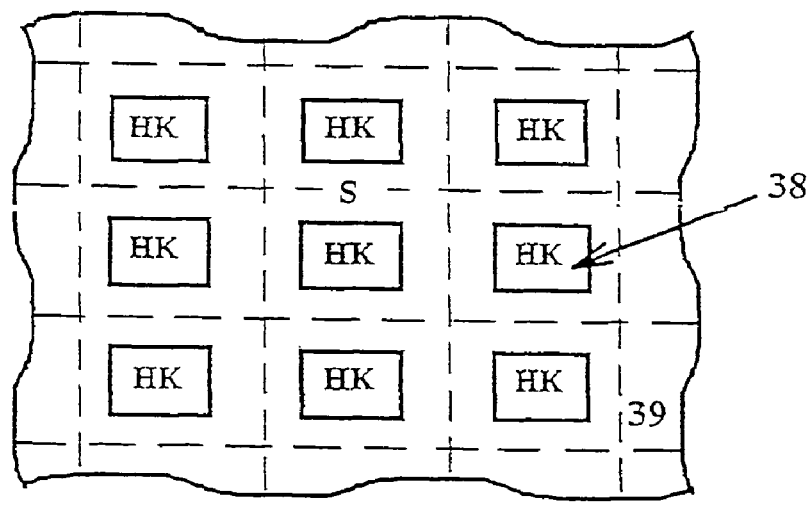
FIG. 6(d) is a schematic top-view at the cross-section II–II' of rectangular cell of the HKS shown in FIG. 5(a), where S regions are all mutually connected.
Figure 6E:
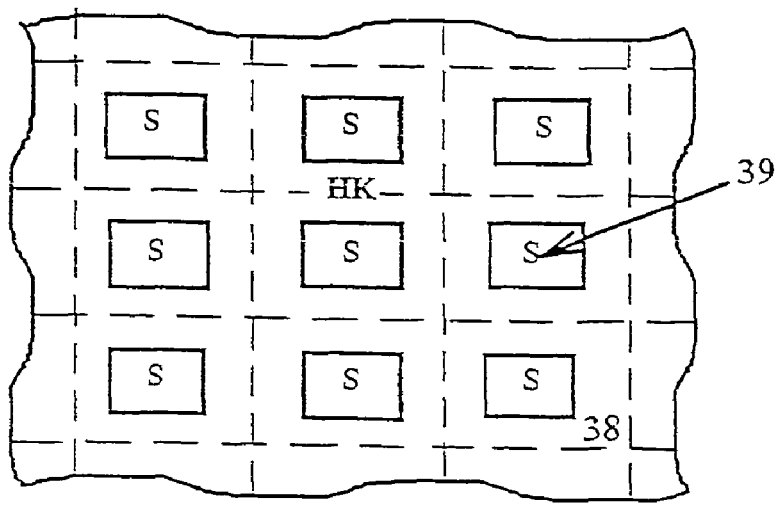
FIG. 6(e) is a schematic top-view at the cross-section II–II' of rectangular cell of the HKS shown in FIG. 5(a), where HK regions are all mutually connected.
Figure 6F:
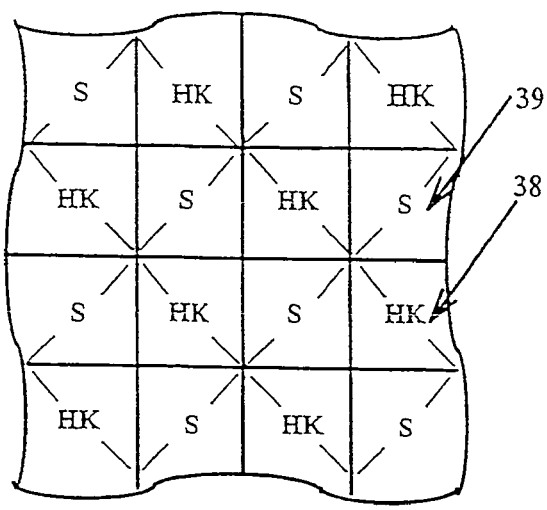
FIG. 6(f) is a schematic top-view at the cross-section II–II' of mosaic square pattern of the HKS shown in FIG. 5(a).
Figure 6G:
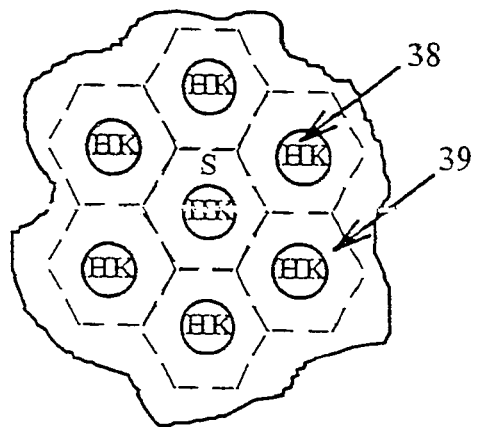
FIG. 6(g) is a schematic top-view at the cross-section II–II' of hexagonal close-packed pattern of the HKS shown in FIG. 5(a), where S regions are all mutually connected.
Figure 6H:
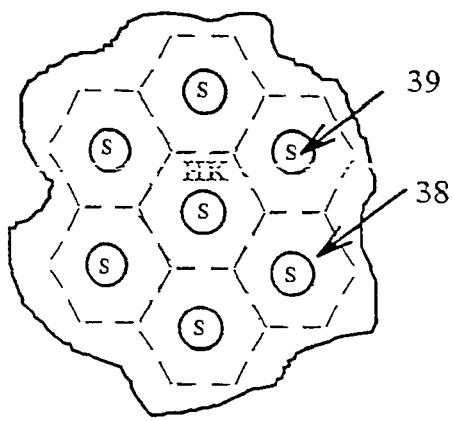
FIG. 6(h) is a schematic top-view at the cross-section II–II' of hexagonal close-packed pattern of the HKS shown in FIG. 5(a), where HK regions are all mutually connected.

In HKS layer, there are many structure patterns for the arrangement of the high permittivity material and the semiconductor region. FIG. 6 shows some arrangements for high permittivity material and semiconductor region as viewed along II–II' section in FIG. 5(a). Cells are demarked by dashed lines between them in the figure. These patterns include interdigitated pattern as shown in FIG. 6(a); a pattern formed by square cells, wherein S regions are all mutually connected as shown in FIG. 6(b); a pattern formed by square cells, wherein HK regions are all mutually connected as shown in FIG. 6(c); a pattern formed by rectangular cells, wherein S regions are all mutually connected as shown in FIG. 6(d); a pattern formed by rectangular cells, wherein HK regions are all mutually connected as shown in FIG. 6(e); a mosaic square pattern as shown in FIG. 6(f); a hexagonal close-packed pattern, wherein regions are all mutually connected as shown in FIG. 6(g); a hexagonal close-packed pattern, wherein HK regions are all mutually connected as shown in FIG. 6(h).

Figure 7A:
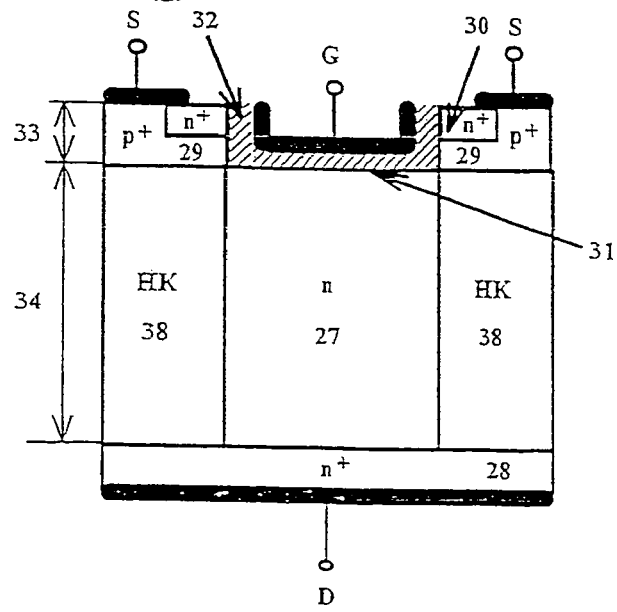
FIG. 7(a) is a schematic diagram of an n-RMOS using interdigitated HKS voltage-sustaining layer.
Figure 7:
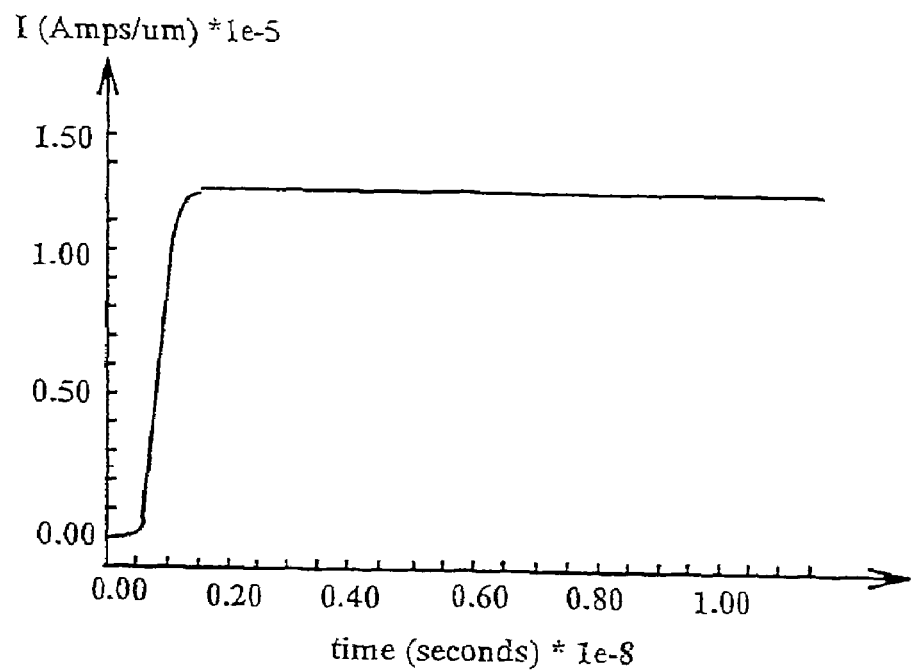
FIG. 7(b) is a schematic diagram of switch-on characteristic of an n-RMOS using interdigitated HKS voltage-sustaining layer.
FIG. 7(c) is a schematic diagram of switch-off characteristic of an n-RMOS using interdigitated HKS voltage-sustaining layer.
Figure 7:
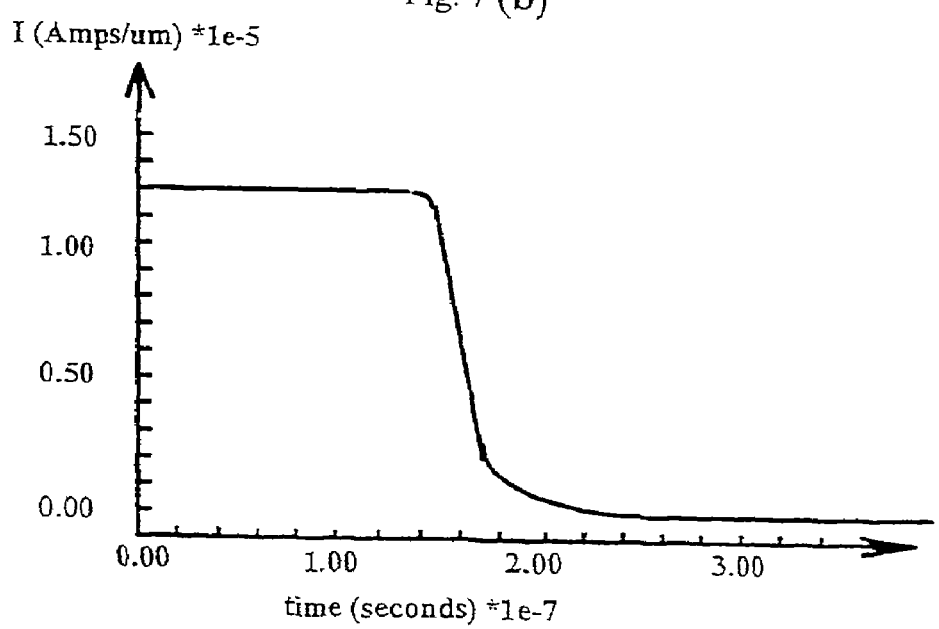

FIG. 7 is a schematic diagram of RMOST structure using HKS layer. The advantages thereof can be illustrated by an example of typical numerical calculation. It is assumed that interdigitated pattern is used, and the figure shown is a pair of horizontally anti-symmetric cells. The width of the pair is 13.04 µm, the n region 27 and the HK region 38 each has the half width, and the width of HKS layer is 65 µm. The donor concentration of the n-region is $2.07 \cdot 10^{15}$ cm$^{-3}$. The relative permittivity of the high permittivity material is 234 (20 times higher than that of silicon). Numerical simulations are performed by using MEDICI/TMA with standard models. The breakdown voltage is 750V and the on-resistance of this device are 750V and 30 mΩ·cm$^2$ respectively, whereas the on-resistance of a conventional RMOST with the same breakdown voltage is 123 mΩ·cm$^2$. FIG. 7(b) and FIG. 7(c) show the turn-on and turn-off transient current characteristics of this device respectively, wherein the voltage supplied is 750V and the serial resistance is $5.75 \cdot 10^7$ Ω·µm. The gate voltage is turned from 0V to 20V and from 20V to 0V. It can be seen that the turn-on time is less than 2 ns and the turn-off time is less than 80 ns.

Obviously, herein, there is no problem of decrease of the breakdown voltage in the case of large current of COOLMOST. On the contrary, the density of space charge in n-region will be decreased with the increasing of the electron number such that the breakdown voltage will be increased. This makes such device have a larger safe-operating area, e.g., the breakdown voltage maintains unchanged even when the current reaches to 100 A/cm$^2$. This is another advantage of this invention.

Still another advantage of this invention is that there is no problem of depletion of n-region 27 caused by a built-in voltage or an additional voltage during current passing through in p-region and n-region, which occurs in the case of a MOST using CB structure. Therefore, the on-resistance will not increase with the increasing of the drain-source voltage.

Figure 8A:
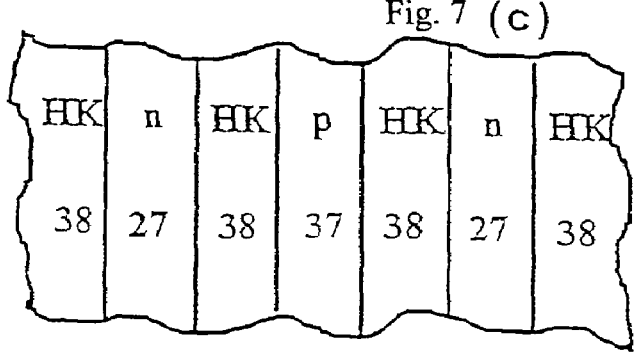
FIG. 8(a) is a schematic top-view at the cross-section III–III' of interdigitated pattern of HKS voltage-sustaining layer containing p-regions and n-regions shown in FIG. 5(d).
Figure 8B:
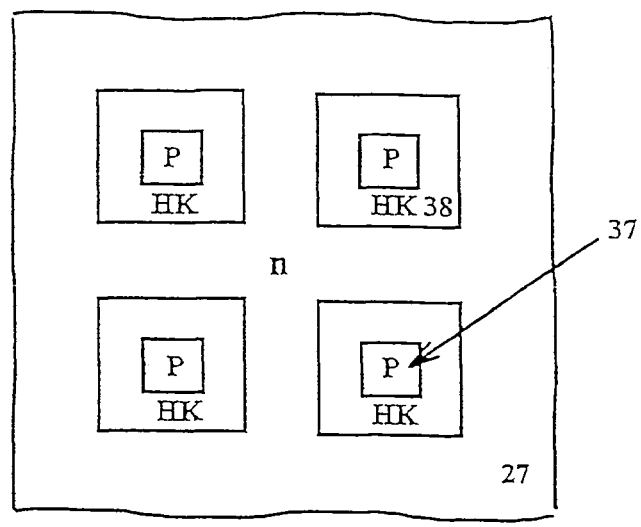
FIG. 8(b) is a schematic top-view at the cross-section III–III' of square cell pattern of HKS voltage-sustaining layer containing p-regions and n-regions shown in FIG. 5(d), where n-regions are all mutually connected.
Figure 8C:
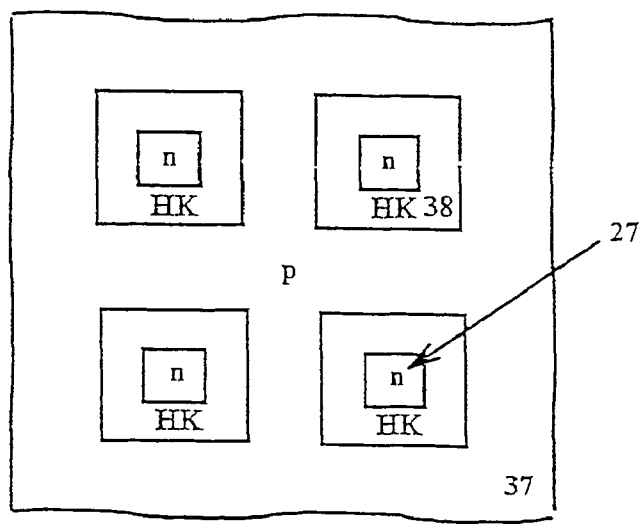
FIG. 8(c) is a schematic top-view at the cross-section III–III' of square cell pattern of HKS voltage-sustaining layer containing p-regions and n-regions shown in FIG. 5(d), where p-regions are all mutually connected.
Figure 8D:
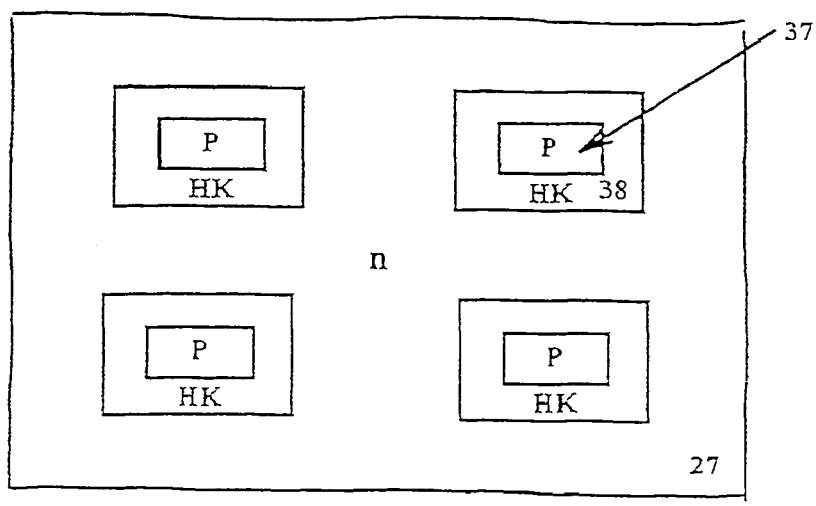
FIG. 8(d) is a schematic top-view at the cross-section III–III' of rectangular cell pattern of HKS voltage-sustaining layer containing p-regions and n-regions shown in FIG. 5(d), where the n-regions are all mutually connected.
Figure 8E:
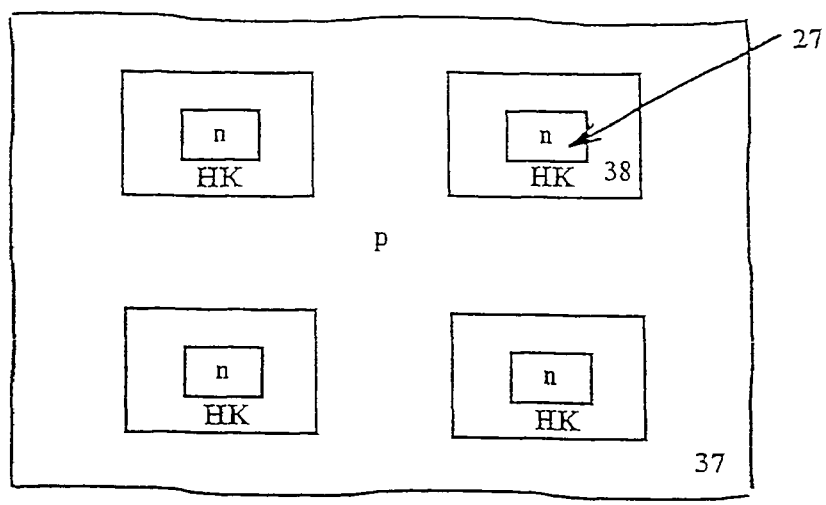
FIG. 8(e) is a schematic top-view at the cross-section III–III' of rectangular cell pattern of HKS voltage-sustaining layer containing p-regions and n-regions shown in FIG. 5(d), where all the p-regions are mutually connected.
Figure 8F:
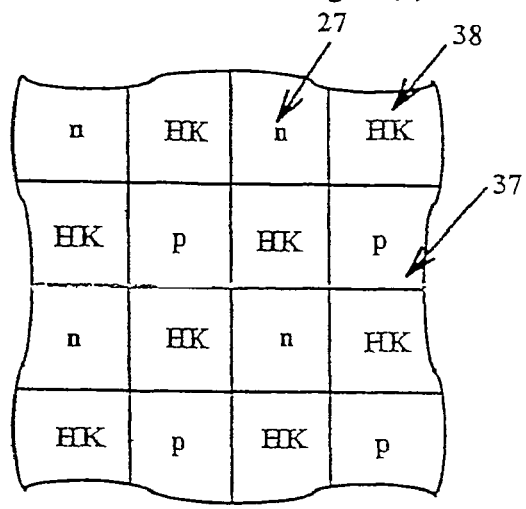
FIG. 8(f) is a schematic top-view at the cross-section III–III' of mosaic square pattern of HKS voltage-sustaining layer containing p-regions and n-regions shown in FIG. 5(d).
Figure 8G:
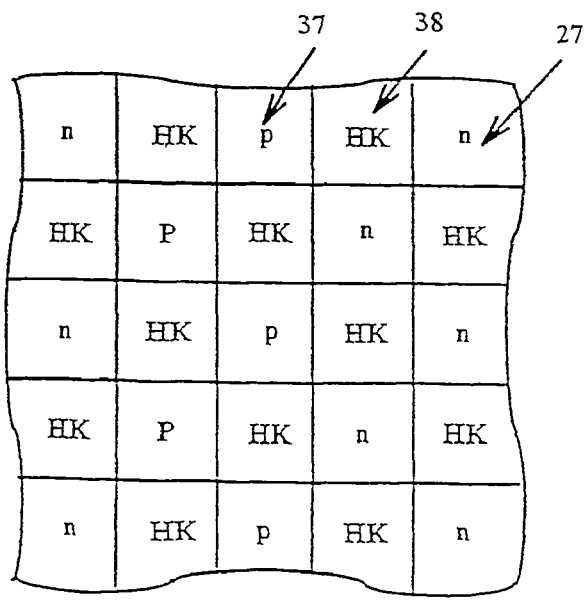
FIG. 8(g) is a schematic top-view at the cross-section III–III' of another mosaic square pattern of HKS voltage-sustaining layer containing p-regions and n-regions shown in FIG. 5(d).
Figure 8:
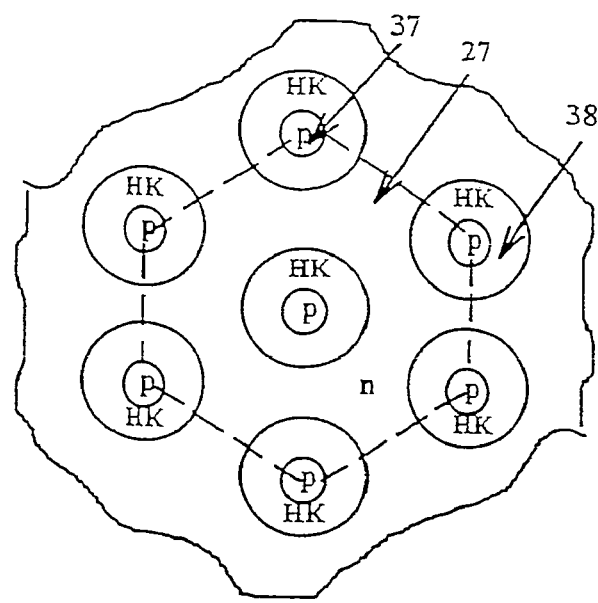
FIG. 8(h) is a schematic top-view at the cross-section III–III' of a hexagonal close-packed pattern of HKS voltage-sustaining layer containing p-regions and n-regions shown in FIG. 5(d), where all the n-regions are mutually connected.
FIG. 8(i) is a schematic top-view at the cross-section III–III' of a hexagonal close-packed pattern of HKS voltage-sustaining layer containing p-regions and n-regions shown in FIG. 5(d), where all the p-regions are mutually connected.
Figure 8:
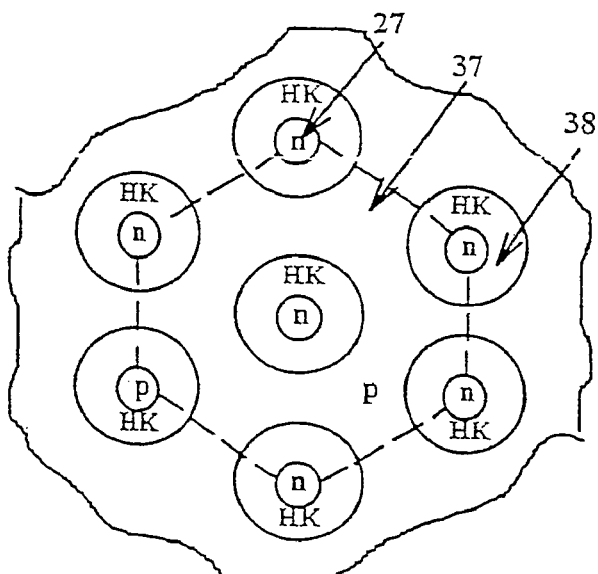

FIG. 8 schematically shows some structures of arrangement of high permittivity material and n-type semiconductor region as well as p-type semiconductor region as viewed along III–III' section in FIG. 5(d). These patterns include an interdigitated pattern as shown in FIG. 8(a); a pattern formed by square cells, wherein the n-regions are all mutually connected as shown in FIG. 8(b); a pattern formed by square cells, wherein the p-regions are all mutually connected as shown in FIG. 8(c); a pattern formed by rectangular cells, wherein the n-regions are all mutually connected as shown in FIG. 8(d); a pattern formed by rectangular cells, wherein the p-regions are all mutually connected as shown in FIG. 8(e); one of the mosaic square patterns as shown in FIG. 8(f); another one of the mosaic square patterns as shown in FIG. 8(g); a hexagonal close-packed pattern, wherein the n-regions are all mutually connected as shown in FIG. 8(h); a hexagonal close-packed pattern, wherein the p-regions are all mutually connected as shown in FIG. 8(i).

Figure 9:
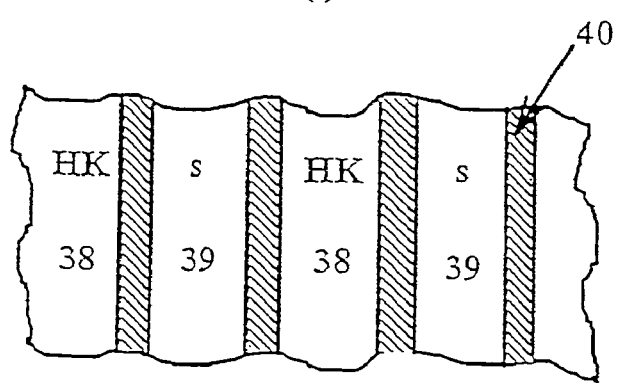
FIG. 9 is a schematic structure of HKS voltage-sustaining layer, wherein a thin and low permittivity silicon dioxide layer is disposed between high permittivity material and semiconductor material.

The above-mentioned high permittivity material is not limited to a single uniform material; it can even be composite material. For instance, in FIG. 6(a), if the semiconductor is silicon, it can be separated with a high permittivity material by a thin silicon dioxide layer 40, as shown in FIG. 9. The shaded region represents silicon dioxide layer 40. Although the permittivity of SiO$_2$ is very low, it will not prevent the electric fluxes of the semiconductor S from flowing to the high permittivity dielectric HK, or the electric fluxes of the high permittivity dielectric HK from flowing to the semiconductor S, as long as the silicon dioxide layer 40 is thin enough.

Figure 10A:
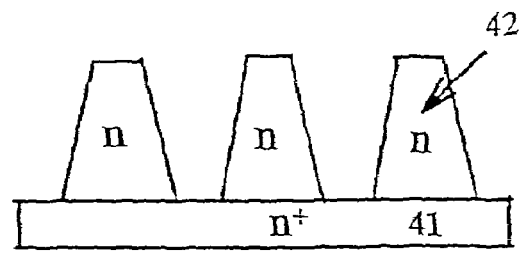
FIG. 10(a) illustrates a process of manufacturing a VDMOST using HKS voltage-sustaining layer structure, wherein a groove having a depth close to the thickness of epitaxial layer is formed by etching in the silicon wafer having n-type epitaxial layers on n$^+$ substrate.
Figure 10B:
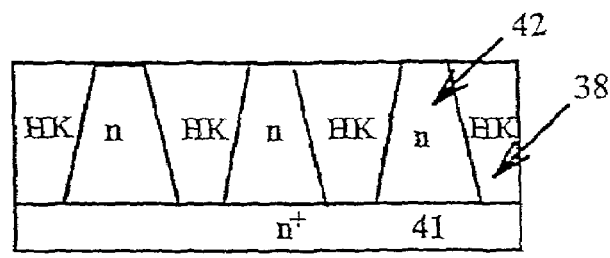
FIG. 10(b) illustrates the process of manufacturing a VDMOST using HKS voltage-sustaining layer structure, wherein the groove is filled with high permittivity dielectric (HK) material.
Figure 10C:
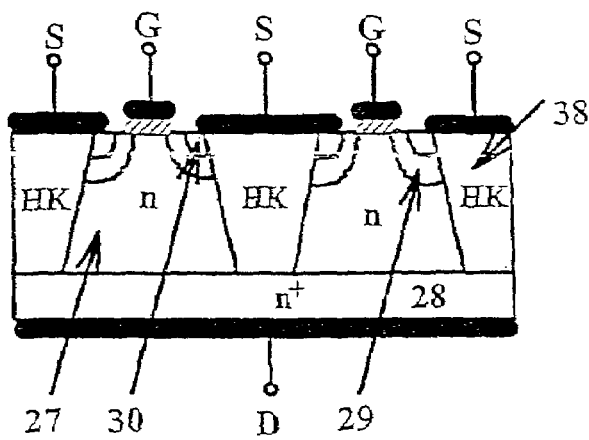
FIG. 10(c) illustrates the process of manufacturing a VDMOST using HKS voltage-sustaining layer structure, wherein active region of the device is made on the surface of the n-type region.

FIGS. 10(a)–10(c) show one method of manufacturing a VDMOST of this invention. A silicon wafer having an n$^+$-silicon substrate 41 and an n-type epitaxial layer 42 is grooved by means of anisotropic etching method, resulted in the situation shown in FIG. 10(a). The grooves have sidewalls and bottoms. Then, the grooves are filled with high permittivity material so as to be the situation shown in FIG. 10(b). Subsequently, p$^+$-source-substrate region 29 and n$^+$-source region 30 are formed by diffusion or ion-implantation in n-region 27. Thereafter, the metal electrodes are made, so that the VDMOST structure shown in FIG. 10(c) is obtained.

Figure 11:
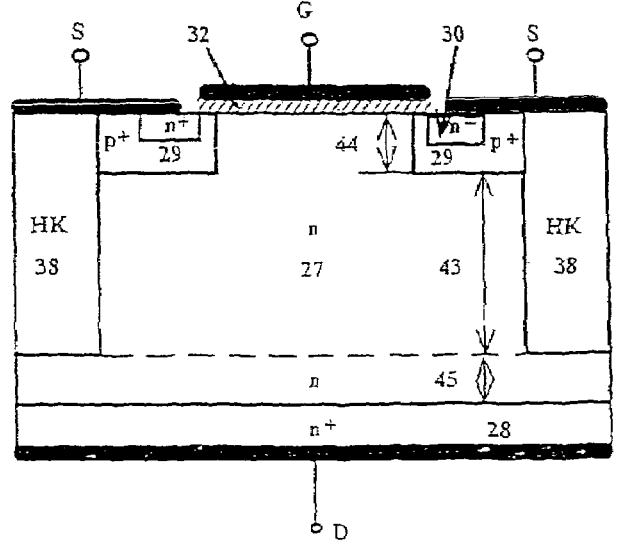
FIG. 11 is a schematic diagram of an n-VDMOST, which is formed in such a manner that the high permittivity material contacts to an n$^+$ drain region via a lightly doped n-region.

FIG. 11 shows another kind of an n-VDMOST using this invention. It is characterized in that the high permittivity material does not directly, but indirectly through an n-region 45, contacts to the n$^+$ drain region 28. Due to the existence of this n-region 45, the resistance of the part close to n$^+$ drain region 28 of the turn-on VDMOST is further diminished. Although when a reverse voltage is applied to drain electrode D and source electrode S, there is a little part of voltage across region 44 and region 45 in the figure, yet the voltage sustained by the device is dominantly across region 43. Therefore, n-region 45 together with n$^+$ drain region 28 is considered as contact layer.

Figure 12:
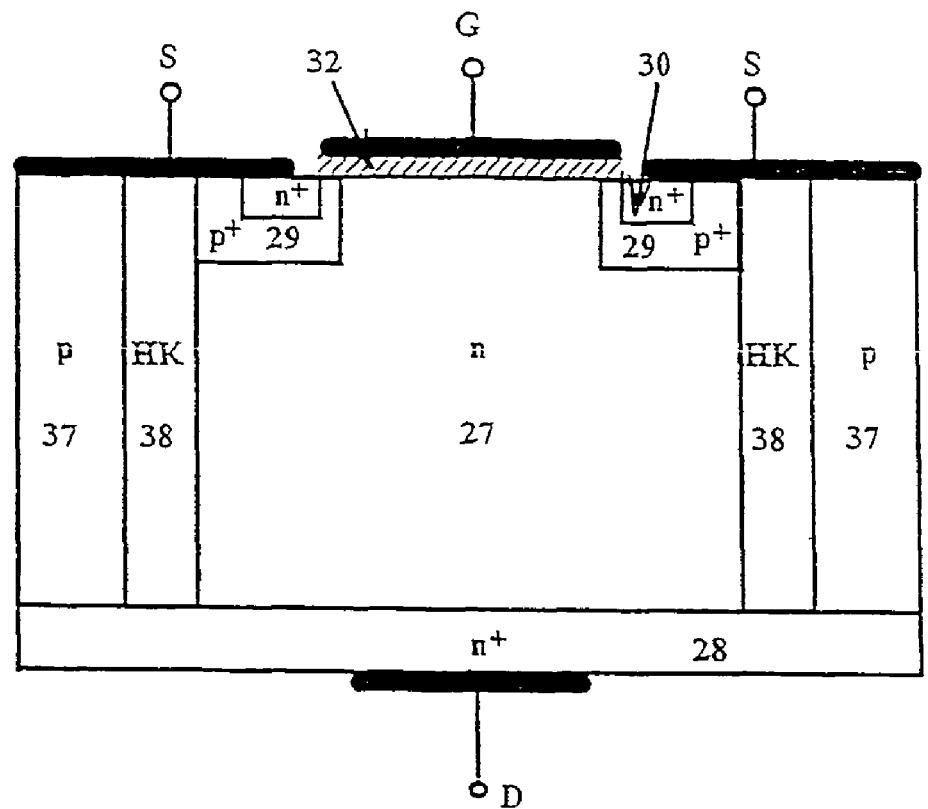
FIG. 12 is a schematic diagram of an n-VDMOST formed by use of the HKS voltage-sustaining layer as shown in FIG. 5(d).

FIG. 12 is a schematic diagram showing one cell of an n-VDMOST, the voltage-sustaining layer thereof using the structure shown in FIG. 5(d) of this invention.

Figure 13:
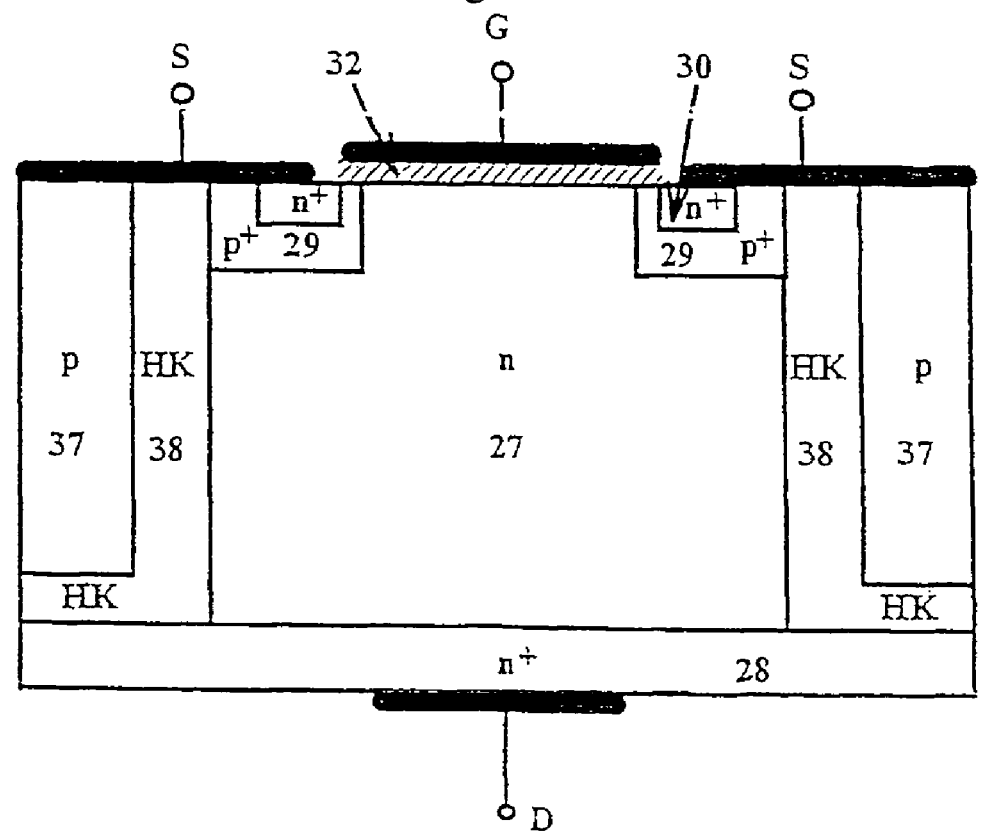
FIG. 13 is a schematic diagram of an n-VDMOST formed by use of the HKS voltage-sustaining layer as shown in FIG. 5(d), wherein the p-region is not in direct contact to the n$^+$ drain region.

FIG. 13 is a schematic diagram showing one cell of another n-VDMOST similar to that shown in FIG. 12, which is formed by using this invention. This figure is different from FIG. 12 in that p-region 37 does not contact directly to the lower n$^+$ drain region 28, but indirectly contacts to it through a thin dielectric layer HK 38. Of course, some areas of the dielectric layer where contact is made to the p-region 37 and n$^+$ drain region 28 can be not high permittivity materials, but be thin and low permittivity materials instead.

Figure 14:
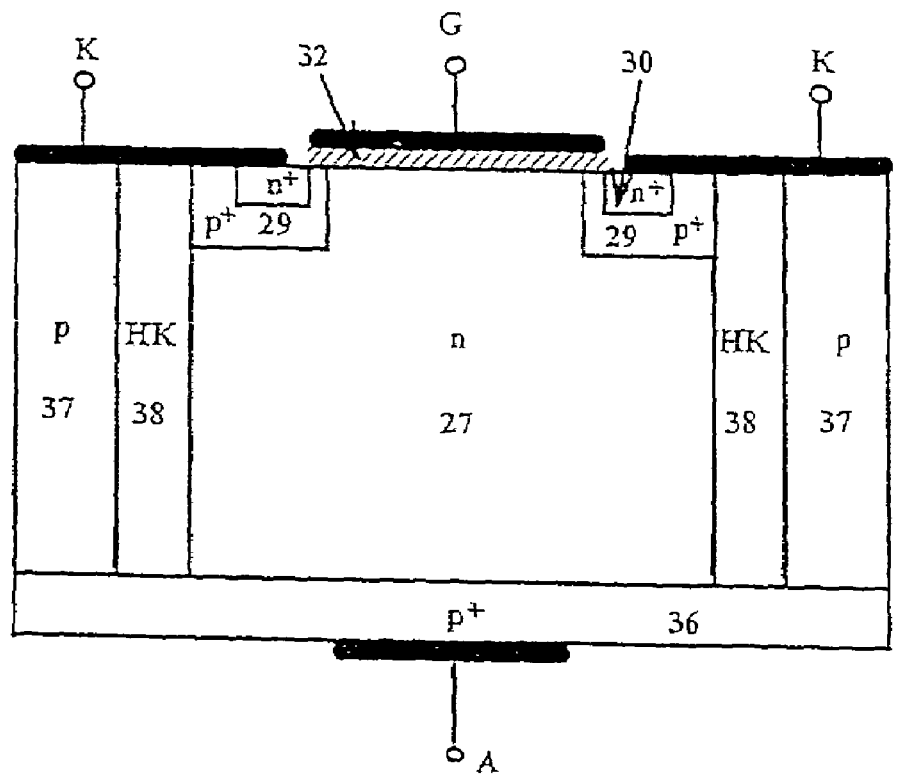
FIG. 14 is a schematic diagram of an IGBT formed by use of the HKS voltage-sustaining layer as shown in FIG. 5(d).

FIG. 14 illustrates an IGBT formed by using this invention. It is different from the VDMOST of FIG. 12 mainly in that the contact layer is a p$^+$-region 36 instead of an n$^+$-region.

Figure 15:
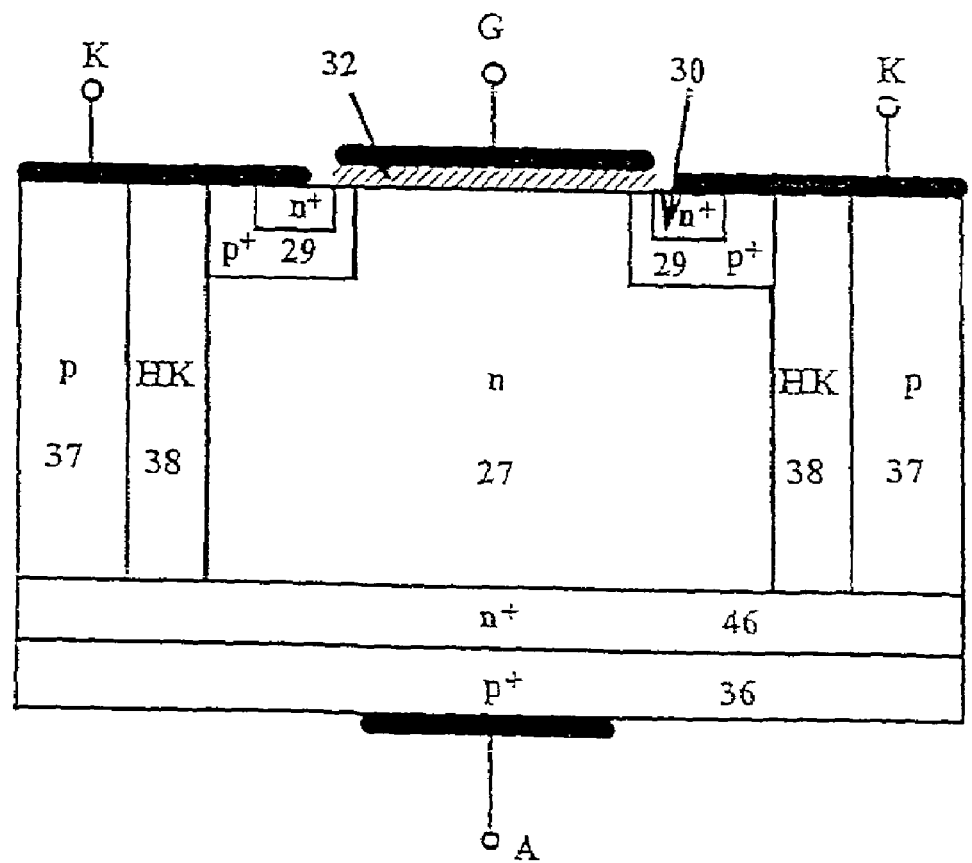
FIG. 15 is a schematic diagram of an IGBT formed by use of the HKS voltage-sustaining layer as shown in FIG. 5(d), wherein the IGBT is formed with a buffer layer.

FIG. 15 illustrates an IGBT having a buffer layer (region 46), which is formed by using this invention. It is different from FIG. 14 mainly in that, in the contact layer, besides the p$^+$ substrate 36, there is an n$^+$ buffer layer 46 thereon.

This invention has been illustrated by many examples stated above, wherein said n-type may be considered as a material of a first conductivity type, and p-type may be considered as a material of a second conductivity type.

Obviously, according to the principle of this invention, the n-type and p-type of various embodiments can be exchanged, which will not influence the contents of this invention. As for a person skilled in the art, various changes and various devices can be made under the guidance of the idea of this invention.

The invention claimed is:

1. A semiconductor device comprising:

a substrate contact layer comprising a semiconductor of a first conductivity type, wherein said contact layer has one planar contact plane on one of its side;

a device feature layer comprising a semiconductor of a second conductivity type, wherein said device feature layer has one planar device feature plane parallel to said contact plane;

a voltage-sustaining layer for sustaining a reverse high voltage disposed between said contact plane and said device feature plane;

wherein said voltage-sustaining layer comprises a plurality of closely packed cells, each cell having only one semiconductor region of a first conductivity type and one dielectric region, a size of a cross-section of each cell parallel to said device feature plane being smaller than a distance between said contact plane and said device feature plane, and, both said semiconductor region and said dielectric region in said cell of said voltage-sustaining layer extending between said contact plane and said device feature plane;

wherein a value of an electric permittivity of said dielectric region in said cell of said voltage sustaining layer is much larger than a value of a electric permittivity of said semiconductor region in said cell of said voltage sustaining layer;

wherein in area of a cross section of said dielectric region parallel to said device feature plane is in the same order of magnitude of an area of a cross section of said semiconductor region parallel to said device feature plane;

wherein a ratio of said cross section of said dielectric region to said cross section of said semiconductor region becomes smaller with increasing distance from said device feature plane to said contact plane;

wherein the semiconductor region of each cell is fully depleted under a reverse voltage close to a breakdown voltage applied across said substrate contact layer and said device feature layer, and in most of an area of each cell, a component of an electric field parallel to said device feature plane;

wherein, under said breakdown voltage, electric fluxes generated by charges of the depleted semiconductor region of each cell beyond a distance to said device feature plane smaller than the size of said cell are terminated by said device feature plane through said dielectric region.

2. The semiconductor device according to claim 1, wherein said dielectric region has at least a part of its surface covered by a thin and low permittivity dielectric layer, wherein a thickness of said low permittivity dielectric layer is much smaller than a size of a cross-section parallel to said device feature plane of said dielectric region in said cell and the permittivity of said low permittivity dielectric layer is much smaller than said electric permittivity of said dielectric region.

3. The semiconductor device according to claim 1, wherein said substrate contact layer comprises a thick heavily doped semiconductor of a first conductivity type.

4. The semiconductor device according to claim 1, wherein said substrate contact layer comprises a thin lightly doped semiconductor of a first conductivity type formed on a thick heavily doped semiconductor of the first conductivity type.

5. The semiconductor device according to claim 1, wherein said substrate contact layer comprises a thin heavily doped semiconductor of a first conductivity type formed on a thick heavily doped semiconductor of a second conductivity type.

6. The semiconductor device of claim 1, wherein said semiconductor region in each cell of said voltage-sustaining layer comprises a drain drift region and said device feature layer comprises a source-body, a source region of a semiconductor of the first conductivity type is made on the device feature layer, a gate-insulator layer and a gate are made around an area of the device feature layer.

7. The semiconductor device of claim 1, wherein said substrate contact layer further comprises a metal.

8. The semiconductor device of claim 1, wherein said device feature layer further comprises a metal.

9. The semiconductor device of claim 1, wherein said device feature layer contact to said dielectric layer further comprises metal.

* * * * *